United States Patent
Joshi et al.

(10) Patent No.: US 10,830,544 B2
(45) Date of Patent: Nov. 10, 2020

(54) SELF-HEALING METAL STRUCTURES

(71) Applicant: Toyota Motor Engineering & Manufacturing North America, Inc., Plano, TX (US)

(72) Inventors: Shailesh N. Joshi, Ann Arbor, MI (US); Naoya Take, Canton, MI (US)

(73) Assignee: Toyota Motor Engineering & Manufacturing North America, Inc., Plano, TX (US)

( * ) Notice: Subject to any disclaimer, the term of this patent is extended or adjusted under 35 U.S.C. 154(b) by 0 days.

(21) Appl. No.: 16/176,121

(22) Filed: Oct. 31, 2018

(65) Prior Publication Data

US 2020/0132400 A1 Apr. 30, 2020

(51) Int. Cl.
| | |
|---|---|
| *H01L 23/36* | (2006.01) |
| *F28F 19/06* | (2006.01) |
| *C23C 16/455* | (2006.01) |
| *F28F 21/08* | (2006.01) |
| *H01L 23/427* | (2006.01) |
| *H01L 21/48* | (2006.01) |
| *H05K 7/20* | (2006.01) |

(52) U.S. Cl.
CPC ........ *F28F 19/06* (2013.01); *C23C 16/45525* (2013.01); *F28F 21/085* (2013.01); *F28F 21/087* (2013.01); *H01L 21/4871* (2013.01); *H01L 23/427* (2013.01); *H05K 7/20936* (2013.01); *F28F 2255/00* (2013.01); *F28F 2265/00* (2013.01)

(58) Field of Classification Search
CPC .. H01L 23/3677; H01L 23/3735; F28F 13/18; F28F 21/089
See application file for complete search history.

(56) References Cited

U.S. PATENT DOCUMENTS

| | | | |
|---|---|---|---|
| 8,347,479 B2 | 1/2013 | Smith et al. | |
| 8,518,531 B2 | 8/2013 | Rohatgi | |
| (Continued) | | | |

OTHER PUBLICATIONS

Ullah, et al., "The Potential of Microencapsulated Self-Healing Materials for Microcracks Recovery in Self-Healing Composite Systems: A Review," Polymer Reviews, vol. 56, Issue 3, Abstract only (2016).

*Primary Examiner* — George R Fourson, III
(74) *Attorney, Agent, or Firm* — Christopher G. Darrow; Darrow Mustafa PC

(57) ABSTRACT

A self-healing metal structure is provided for transferring heat between an electronics component and a substrate. The self-healing metal structure includes a base metal structural component. A phase change material is provided adjacent at least a portion of the base metal structural component. A protective component at least partially encapsulates the phase change material. Upon the presence of a spatial defect in the base metal structural component, the phase change material reacts with the base structural component to form an intermetallic compound to at least partially occupy the spatial defect. The phase change material at least partially encapsulated with the protective component may be disposed within the base metal structural component as a plurality of separate capsules incorporated therein, or the phase change material at least partially surrounds the base metal structural component.

18 Claims, 4 Drawing Sheets

(56) References Cited

U.S. PATENT DOCUMENTS

| | | | | |
|---|---|---|---|---|
| 10,446,466 B1* | 10/2019 | Milne | ................... | H01L 23/562 |
| 2003/0215981 A1* | 11/2003 | Strouse | ................. | B23K 35/26 |
| | | | | 438/118 |
| 2006/0284314 A1* | 12/2006 | Lin | ....................... | H01L 23/367 |
| | | | | 257/737 |
| 2010/0020499 A1* | 1/2010 | Lee | ................... | H01L 23/3677 |
| | | | | 361/709 |
| 2011/0292614 A1* | 12/2011 | Horng | ................ | H01L 23/3677 |
| | | | | 361/720 |
| 2013/0264702 A1* | 10/2013 | Nishi | ..................... | H01L 23/36 |
| | | | | 257/712 |
| 2014/0070388 A1* | 3/2014 | Huang | ............. | H01L 23/49506 |
| | | | | 257/676 |
| 2015/0044517 A1 | 2/2015 | Mikhaylik et al. | | |
| 2015/0214192 A1* | 7/2015 | Lin | .................... | H01L 23/3736 |
| | | | | 257/737 |
| 2016/0227641 A1* | 8/2016 | Ku | ....................... | H05K 1/0206 |
| 2017/0053751 A1 | 2/2017 | Zhi et al. | | |
| 2017/0318661 A1* | 11/2017 | Matsunaga | ......... | H01L 23/3675 |
| 2018/0273373 A1* | 9/2018 | Pindl | .................... | B81B 7/0038 |
| 2019/0110356 A1* | 4/2019 | Silvano De Sousa | ....................... | |
| | | | | H05K 1/0203 |
| 2019/0221353 A1* | 7/2019 | Hwang | ................... | H02J 50/70 |

* cited by examiner

SELF-HEALING METAL STRUCTURES

TECHNICAL FIELD

The present disclosure generally relates to substrates for coupling with electronic components and, more particularly, to self-healing metal substrates and structures.

BACKGROUND

The background description provided herein is for the purpose of generally presenting the context of the disclosure. Work of the presently named inventors, to the extent it may be described in this background section, as well as aspects of the description that may not otherwise qualify as prior art at the time of filing, are neither expressly nor impliedly admitted as prior art against the present technology.

Quality electronic components should exhibit dynamic durability and provide reliable mechanical support as well as electrical insulation in changing environments. Metal support structures in semiconductor assemblies may be subjected to mechanical and/or thermal stresses as a result of temperature cycling. These mechanical and/or thermal stresses may cause conventional metal structures to prematurely crack or fracture, which can lead to detrimental conditions ranging from reduced functionality to a complete failure of the metal structure. In one non-limiting example, with respect to mesh materials used for bonding semiconductors to substrates, such stresses may cause the mesh to crack or fracture, which may ultimately lead to a failure of the bond between the semiconductor and the substrate.

Accordingly, it would be desirable to provide an improved and cost effective support structure that preserves the integrity and performance of the structure, while also maintaining a superior thermal conductivity.

SUMMARY

This section provides a general summary of the disclosure, and is not a comprehensive disclosure of its full scope or all of its features.

In various aspects, the present teachings provide a self-healing metal structure. The self-healing metal structure may include a base metal structural component. A phase change material may be provided adjacent at least a portion of the base metal structural component. A protective component at least partially encapsulates the phase change material. Upon the presence of a spatial defect in the base metal structural component, the phase change material reacts with the base structural component to form an intermetallic compound to at least partially occupy the spatial defect. In various aspects, the phase change material, at least partially encapsulated with the protective component, may be disposed within the base metal structural component as a plurality of separate capsules incorporated therein, or the phase change material at least partially surrounds the base metal structural component.

In other aspects, the present teachings provide a self-healing metal structure assembly for transferring heat between an electronics component and a substrate. The self-healing metal structure assembly may include an electronics component and a substrate. A base metal structural component may be provided, permitting thermal communication between the electronics component and the substrate. The assembly includes a phase change material in contact with at least a portion of the base metal structural component. A protective metal component is provided encapsulating the phase change material. Upon the presence of a spatial defect in the base metal structural component, the phase change material reacts with the base metal structural component to form an intermetallic compound to at least partially occupy the spatial defect.

In still other aspects, the present teachings provide a method for making a self-healing metal structural component useful for transferring heat between components, such as an electronics component and a substrate. The method includes surrounding at least a portion of a base metal structural component with a phase change material. The phase change material has a melting point lower than a melting point of the base metal structural component. The method includes encapsulating at least a portion of the phase change material with a protective metal component. Upon the presence of a spatial defect in the base metal structural component, the method includes permitting the phase change material to react with the base metal structural component to form an intermetallic compound to at least partially occupy the spatial defect.

Further areas of applicability and various methods of enhancing the above technology will become apparent from the description provided herein. The description and specific examples in this summary are intended for purposes of illustration only and are not intended to limit the scope of the present disclosure.

BRIEF DESCRIPTION OF THE DRAWINGS

The present teachings will become more fully understood from the detailed description and the accompanying drawings, wherein.

Figure 1:
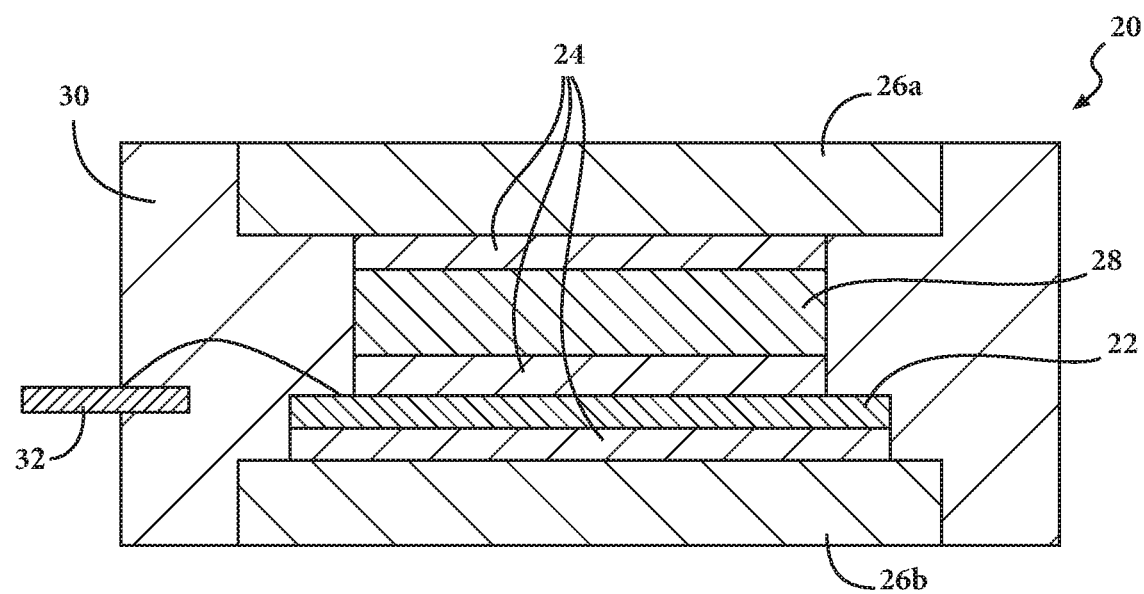
FIG. 1 is a schematic view of a power module shown with a double-sided cooling feature according to various aspects of the present technology.

It should be noted that the figures set forth herein are intended to exemplify the general characteristics of the methods, algorithms, and devices among those of the present technology, for the purpose of the description of certain aspects. These figures may not precisely reflect the characteristics of any given aspect, and are not necessarily intended to define or limit specific embodiments within the scope of this technology. Further, certain aspects may incorporate features from a combination of figures.

DETAILED DESCRIPTION

The present technology generally provides a self-healing metal structure/bonding material that can restore cracks and other spatial defects that may form within a metal structure or at a surface thereof. Non-limiting examples of applications for such a self-healing metal structure include aspects that provide structural support while transferring heat between an electronics component and a substrate in order to cool the electronics component; for use with power modules of a power control unit; and for use with a circuit board, or the like, where various components may benefit from a combination of structural integrity and heat transfer. The self-healing metal structure may include a base metal structural component. A phase change material may be provided adjacent at least a portion of the base metal structural component. The phase change material will exhibit a melting point lower than a melting point of the base metal structural component. A protective component may be included to at least partially encapsulate the phase change material. Thus, the protective component may keep the phase change material adjacent to or in close proximity to the base metal structural component.

Upon the presence of a spatial defect in the base metal structural component, the phase change material, when in liquid or molten form, reacts with the base structural component to form an intermetallic compound to at least partially occupy the spatial defect. As will be described below in more detail, the phase change material, at least partially encapsulated by the protective component, may be disposed within the base metal structural component itself as a plurality of separate capsules incorporated therein, or the phase change material at least partially surrounds the base metal structural component. The present technology also provides method for making a self-healing metal structural component useful for transferring heat between components, such as an electronics component and a substrate.

As used herein, the term "spatial defect" means a crack, fault, tear, cavity, fracture, separation, pore, deformation, imperfection, or similar defect in a crystalline or lattice structure of the structural component. The spatial defect may be fine or coarse, and may or may not be visibly detectable, but may still affect or impair at least one physico-mechanical property of the materials (for example, electrical conductivity, magnetic permeability, strength, density, plasticity, etc.). The spatial defect may be caused by a separation of metal bond, broken fibers, a separation of joints, and a combination thereof. The spatial defect may begin at a point, and include a line, plane, or three dimensional shape.

Self-healing techniques are useful in a variety of applications, ranging from flexible electronics to battery technology. The present technology is applicable in many of those applications, and may be particularly useful with metallic bonding of materials in power electronics. For example, environmentally-friendly vehicles such as hybrid, electric, and fuel cell vehicles commonly use power control units (PCUs) to convert alternating current (AC) to direct current (DC), and vice-versa. The PCU may include devices such as Insulated Gate Bipolar Transistors (IGBTs) that may be packaged, for example, in a power module. Previously, self-healing techniques have often relied on the healing of polymeric materials. In the case of a power module, for example, polymeric materials are not typically suitable as they possess lower electrical and thermal conductivity as compared to solder, and most polymers may degrade when exposed to high temperatures. The application of self-healing techniques for power modules needs to address several criteria that range from the selection of materials, manufacturing, shape, and maintenance of thermal and electrical properties, similar to solder, after the healing process. As will be described, the present technology makes use of a core-shell based capsule, where a metallic shell may break, releasing a low melting point core material (i.e., phase change material) to heal cracks formed inside of a solder/bonding layer.

In addition to being useful with various electronics components and circuit boards, the present technology may be particularly useful with single-sided or double-sided cooling of power modules. FIG. 1 is a schematic view of an exemplary power module 20 shown with a double-sided cooling technique according to various aspects of the present technology. The power module 20 includes a semiconductor electronics component 22, such as an IGBT, that is sandwiched between self-healing metal structures 24, as defined herein and including solder, provided as bonding materials electrically connected to electrodes 26, 28, such as copper. In one example, the upper electrode 26a may be a component for an emitter, and the lower electrode 26b may be a component for a collector. The components of the power module 20 may be secured in place in a polymer resin 30 for electrical isolation, and may include various wiring and external connections 32.

In the example of the semiconductor electronics component 22 being an IGBT, it is generally understood that the IGBT will switch ON and OFF nearly continuously to modulate current from DC to AC (battery to motor) or from AC to DC (generator to battery). The continuous, or near continuous, switching of the IGBT device(s), in combination with the mismatch of the coefficient of thermal expansion (CTE, "$\alpha$") between the IGBT and the adjacent solder substrates, i.e. self-healing metal structures 24, may cause thermal fatigue to develop inside the self-healing metal structures 24 that ultimately leads to the formation of micro cracks forming therein, which may eventually grow and damage the power module. Generally, the higher the operational temperature of the electronic device, the more severe the thermal fatigue, and the higher likelihood for crack formation.

Figure 2A:
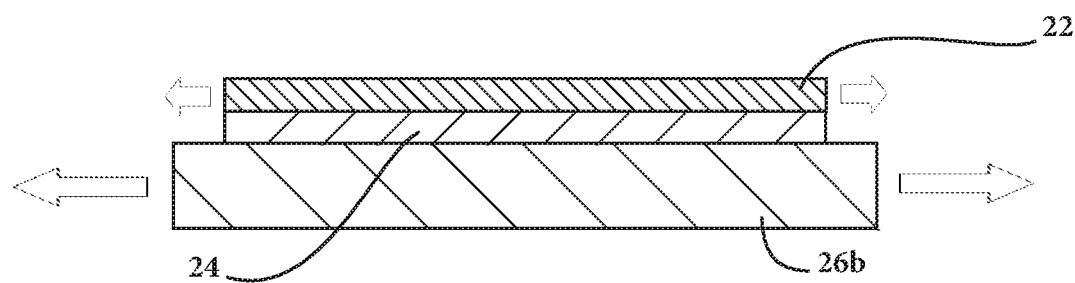
FIG. 2A illustrates a difference in magnitude of thermal stress/displacement of different components, such as an electronics component and a metal substrate.
Figure 2B:
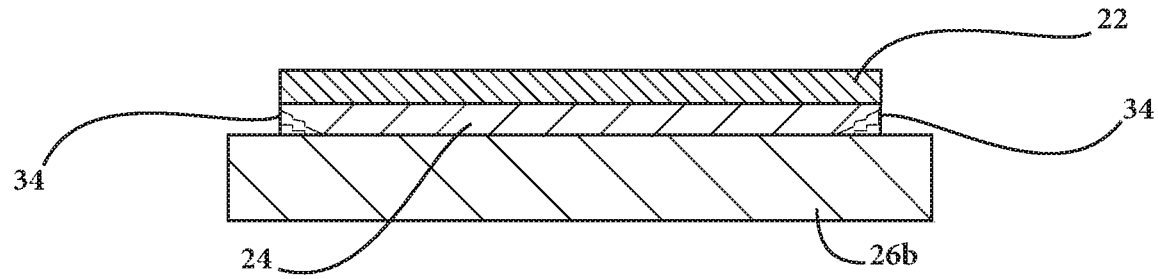
FIG. 2B illustrates crack formation due to the difference in thermal stress/displacement.
Figure 5:
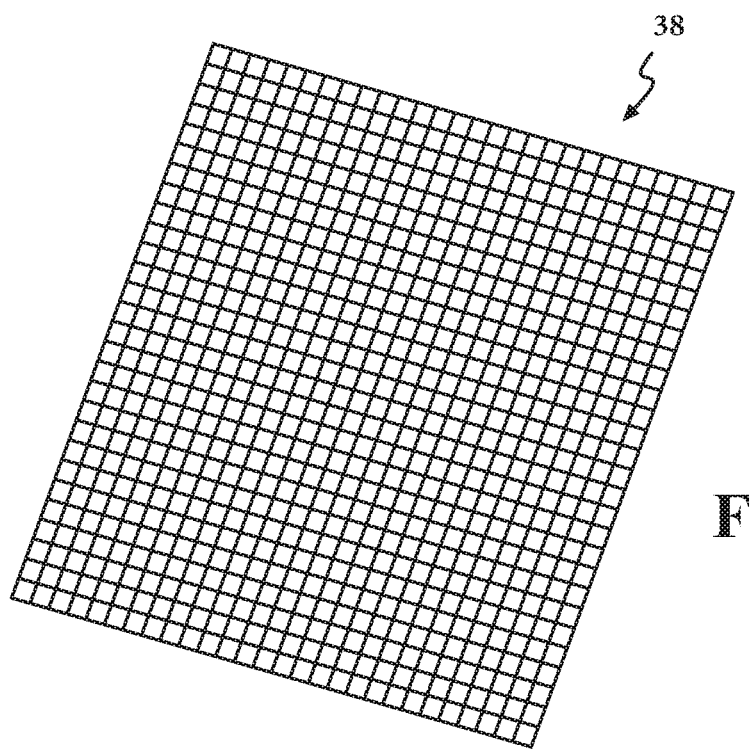
FIG. 5 is a perspective view of an exemplary mesh bonding material provided as the self-healing metal structural support.
Figure 6:
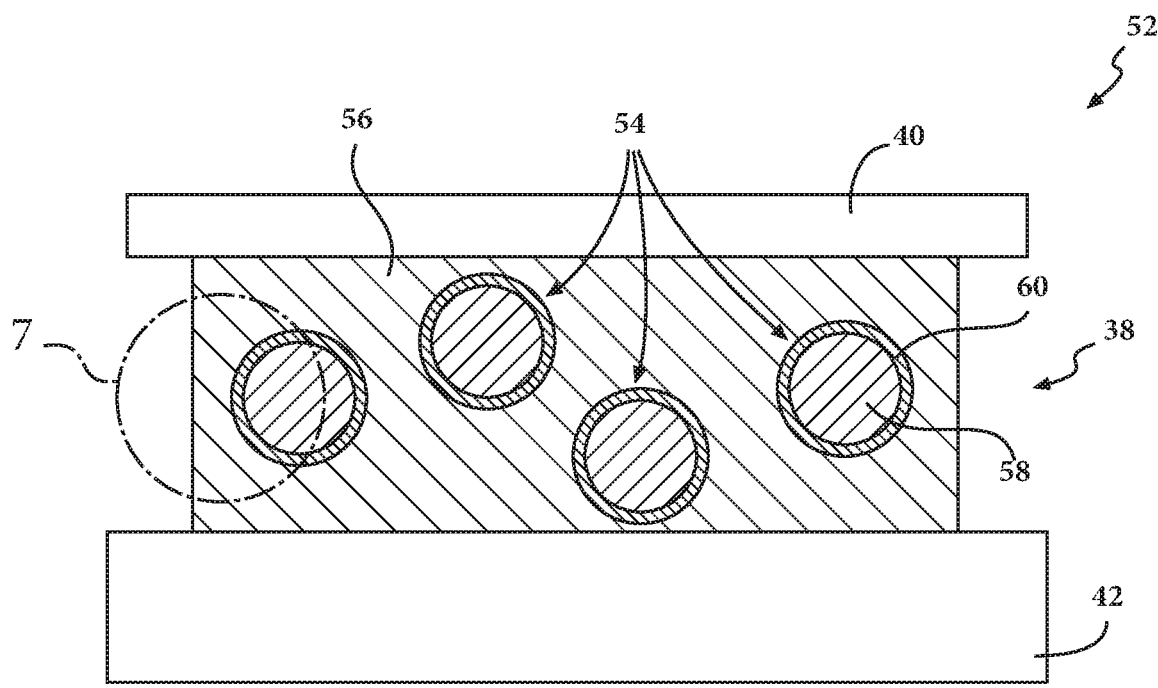
FIG. 6 illustrates a schematic view of yet another exemplary self-healing metal structural support assembly with self-healing capsules provided encapsulated within the metal structural support member.

FIGS. 2A and 2B illustrate how this mismatch in CTE may lead to crack propagation. FIG. 2A provides directional arrows of different sizes to schematically illustrate a difference in magnitude of the thermal expansion. For example, silicon, which may be used in the electronics component 22 has a CTE of $\alpha=3\sim5$ ppm/K, while copper, which may be used in the electrode 26 has a CTE of $\alpha=16.8$ ppm/K. This difference in CTE can ultimately lead to the formation of cracks 34 in the solder 24 as shown in FIG. 2B. The self-healing techniques of the present technology useful in repairing such cracks 34 will now be discussed in detail with specific reference to FIGS. 3-7, but are also applicable to repairing the cracks 34 in FIG. 2B. For example, the capsules 54 as shown in FIGS. 6-7 are also useful as included in the solder layer of FIGS. 1-2.

Figure 3:
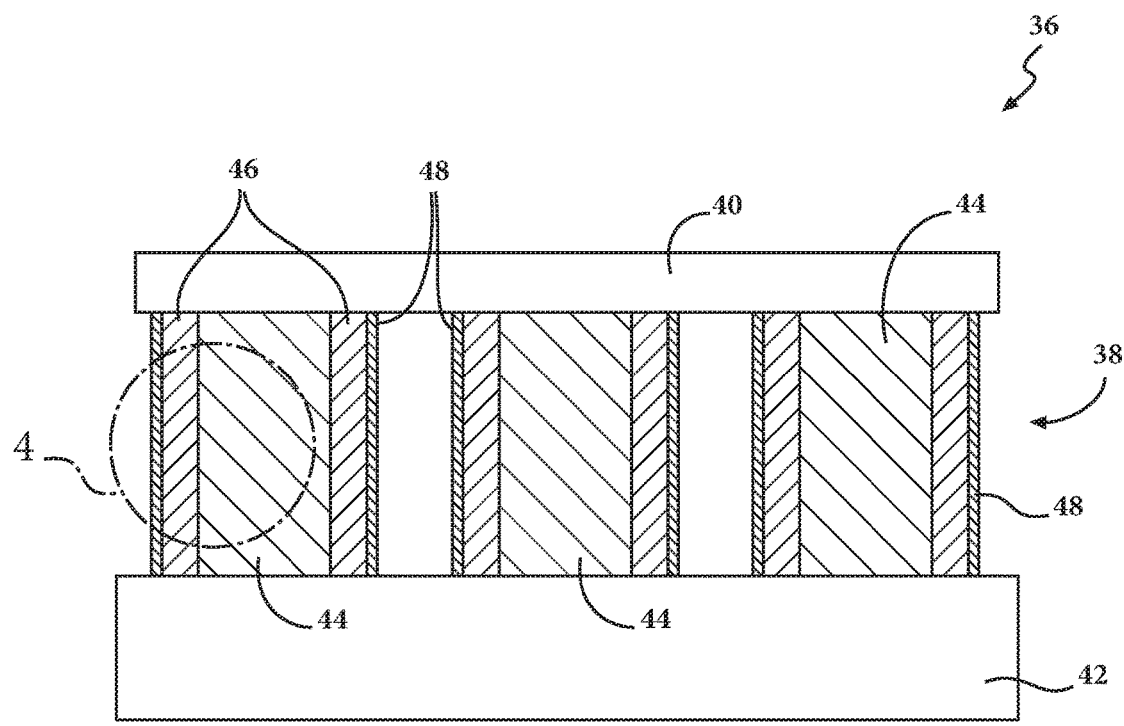
FIG. 3 illustrates a schematic view of another exemplary self-healing metal structural support assembly providing a thermal transfer between an electronics component and a substrate according to various aspects of the present technology.

FIG. 3 illustrates a schematic view of another exemplary self-healing metal structural support assembly 36 that may be useful, in one example, for coupling a self-healing metal structure 38 between an electronics component 40 and a substrate 42 according to various aspects of the present technology. As used herein, the broad term "electronics component" is not meant to be limiting and can include various electronic circuits, integrated circuits, power semiconductors, and silicon-containing devices and chips as are known in the art. Generally, the electronics component 40 can be any basic or discrete device for use in an electronic system used to affect electrons and/or their associated fields. The electronics component 40 can also include any number of leads, lead wires, or electrical terminals; it can be active, passive, or electromagnetic. In various aspects, the electronics component 40 may be an IGBT, discussed above, or a wideband gap semiconductor (WBG) widely used in hybrid, electric, and fuel cell vehicles. In certain aspects, the electronics component 40 may include silicon as a power semiconductor material. In other aspects, silicon carbide (SiC) and gallium nitride (GaN) may be more suitable for power semiconductor devices such as those needed by electric vehicles.

Although shown as a substantially rectangular components in FIG. 3, it should be understood that the electronics component 40 and the substrate 42 may be provided with any shape, size, and dimensions suitable for the ultimate purpose and intended use. As shown in FIGS. 3 and 5, the self-healing metal structure 38 may be provided with a mesh bonding material structure configured to offer structural support as well as serving as a heat transfer element, permitting thermal communication between the electronics component 40 and the substrate 42. Examples of such thermal communication may include both conduction and fluid convection. In various aspects, the self-healing metal structure 38 includes a base metal structural component 44 that serves as a bonding structure, while additionally is used to pass current from the electronics component 40 to the substrate 42.

While shown as a mesh bonding material structure, the base metal structural component 44 may be a substantially solid component, or have various solid areas or regions. The base metal structural component 44 may be provided with a plurality of cooling structures configured as fins, posts, micro-fins, and the like (not shown), disposed in strategic locations in order to assist in the ability of the base metal structural component 44 to transfer heat from the electronics component 40 to the substrate 42. In general, the base metal structural component 44 can include various metals known for their structural support and thermal transfer functions. It is envisioned that at least a portion of the base metal structural component 44 can also include non-metal materials in addition to metal components, or portions/regions may be provided with a metal alloy or metal composite. In various aspects, nickel and copper may be presently preferred metals for the base metal structural component 44 due to the combination of high strength and good thermal transfer properties, as well as their use in forming intermetallic compounds, as will be discussed below. The substrate 42 generally can include any material that can function as a heat sink and is electrically conductive, preferably including a metal.

The self-healing metal structures 38 of the present technology include a phase change material 46, preferably containing a metal, metal alloy, or metallic element that both has a low melting point and is capable of forming an intermetallic compound with one or more other metal/metallic elements, for example, that is present in the base metal structural component 44.

The base metal structural component 44 can be a solid or have a mesh shape and structure. In aspects with a base metal structural component 44 being a mesh shape, or where the base metal structural component is provided defining apertures, or does not have a large continuous section in accordance with the design as shown in FIG. 3, the phase change material 46 may be provided as being adjacent to, surrounding (in contact with), or encapsulating at least a portion of the base metal structural component 44, as detailed in FIG. 3. For certain mesh bonding materials, the mesh bonding material may be positioned between the electronics component 40 and the substrate 42 and undergo a reflow process. In other aspects, the base metal structural component 44 can be arranged as a ball grid array (BGA) pattern having a plurality of spaced apart interconnection points.

As detailed in FIG. 6, in aspects where the base metal structural component 56 is substantially continuous, or with large volume sections, the phase change material 58 may be provided as a core component of a plurality of capsules 54 incorporated within the base metal structural component 56. For example, FIG. 6 illustrates a schematic view of another exemplary self-healing metal structural support assembly with self-healing capsules 54 provided encapsulated within the base metal structural component 56. It is also envisioned that aspects can be provided using a combination of the features of FIGS. 3 and 6, for example using the self-healing capsules 54 along with a phase change material 46 coating or substantially surrounding at least a portion of an exterior of the base metal structural component 44.

In all aspects, the phase change material 46, 58 should exhibit a melting point that is lower than an operating temperature of the electronics component, as well as lower than the melting point of base metal structural component 44, 56. As such, the phase change material 46, 58 should generally be in a liquid state during operation of the electronics component 40. Thus, selection of the phase change material 46, 58 can be based on the device junction temperature, as well as the materials used in the base metal structural component 44, 56. Generally, the phase change material 46, 58 can be any material, selected based on the electronics device operation temperature and melting point, that will form an intermetallic compound with the base metal structural support component 44, 56. Non-limiting examples of an appropriate metal for use in the phase change material can include tin, indium, and mixtures thereof.

In order to contain the liquid phase of the phase change material 46, 58 to a specific area, a protective component 48, 60 is generally provided at least partially encapsulating the phase change material 46, 58. As shown in FIG. 3, the protective component 48 keeps the phase change material 46 adjacent the base metal structural component 44. As shown in FIG. 6, the protective component 60 keeps the phase change material 58 located within the separate capsules 54 disposed within the base metal structural component 56. In various aspects, the protective component 48, 60 can include a metal, such as platinum, aluminum, or alumina. Other materials are also contemplated for use, depending on the design criteria. The layer of the protective component 48, 60 does not need to be very thick in order to serve its intended purpose; however it should have a thickness sufficient to robust and pin-hole free, to prevent any leaks. Thus, in various aspects, the protective component 48, 60 can include a suitable metal applied using atomic layer deposition (ALD) techniques. It should be understood that the thickness of the capsule 54 as well as the thickness of the protective component 60 will influence the point at which the capsule breaks and releases the phase change material. Depending upon the application, the thickness of the capsule 54 can be tuned based on the CTE mismatch, the type of solder system (preform or paste), device operating temperature, and location of the capsules inside the self-healing metal structural component. In one example, by strategically placing the capsules 52 where the stress concentration is at a maximum, for example, towards the four corners of a power device or electronics component 40, complete healing of the cracks may be more probable.

As briefly referenced above, the base metal structural component 44, 56 should include at least one metallic element that is capable of forming an intermetallic compound with one or more other metallic elements, for example, that is present in the phase change material 46, 58. An intermetallic compound contains two or more metallic elements that react or are otherwise combined to form a new phase, together with its own composition, crystal structure, melting temperature, and various other properties. In various aspects, in addition to the typical metals, the metallic elements that make an intermetallic compound may also include post-transition metals, such as Al, Ga, In, Tl, and Sb; as well as metalloids, such as Si, Ge, As, Sb, and Te. As opposed to traditional alloy bonding, intermetallic compounds may have partly ionic bonds. In various aspects, the crystal structure of the intermediate composition may be quite different from the primary components, and thus the mechanical properties of an intermetallic compound may be more similar to those of ceramic materials.

Two examples of the most common types of intermetallic compounds are copper/tin (CuSn) and nickel/tin (NiSn) intermetallics. CuSn intermetallic compounds may occur in two distinct phases. The first phase of CuSn intermetallic is formed nearest the copper interface, and is designated as 'e-phase' $Cu_3Sn$ intermetallic. A layer of 'n-phase' $Cu_6Sn_5$ may form on top of the initial layer of e-phase and may be thicker, including the bulk of the CuSn intermetallic layer. In many aspects, lead-free electronics use a surface finish known as ENIG, which uses electroless nickel plating as a barrier or diffusion layer between the solder alloy and the underlying copper. Nickel/tin intermetallics may form at a much slower rate than that of CuSn intermetallics. The intermetallic formed between nickel and tin is known as δ-phase intermetallics, designated as $Ni_3Sn_4$.

Stoichiometric intermetallic compounds, represented in a phase diagram by a vertical line, have a fixed composition, with non-limiting examples including AlSb, $MoSi_2$, $Fe_3C$, $MgNi_2$, $Mg_2Ni$. Non-stoichiometric intermetallic compounds, sometimes referred to as intermediate solid solutions, may have a range of compositions, with non-limiting examples including $CuAl_2$, $Mg_2Al_3$, $TiAl_3$, beta phase in Brass (CuZn), gamma phase in MoRh. Additional useful intermetallic compounds may include $Pt_3Sn$, PtSn, $PtSn_2$, InSn, $InSn_4$, $Ni_3Al$, $Ti_3Al$, $Al_2CuMg$, $Mg_2Si$, $MgCu_2$, $MgZn_2$, NbTi, $Nb_3Sn$, NbZr, $Nb_3Al$, $Nb_3Ge$.

Figure 4A:
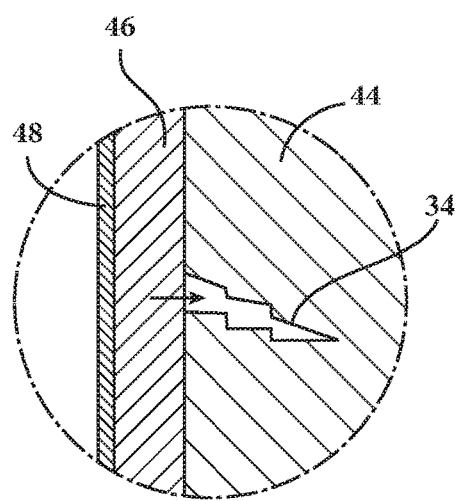
FIGS. 4A and 4B are partial magnified views of FIG. 3, illustrating crack propagation and self-healing according to various aspects of the present technology.
Figure 4B:
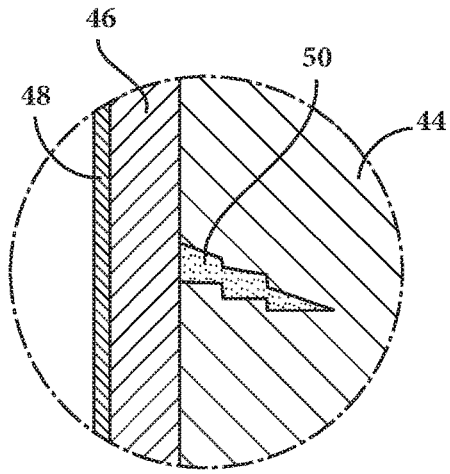

The present technology provides metal structure assemblies 36, 52 that are self-healing, such that spatial defects that may occur in response to repeated mechanical and thermal stresses can be healed in a timely fashion, in many instances immediately upon their formation, in order to preserve the integrity and performance of the metal structure assemblies 36, 52. FIGS. 4A and 4B are partial magnified views of the metal structure assembly 36 as provided in FIG. 3, illustrating crack propagation (FIG. 4A) and self-healing (FIG. 4B) according to various aspects of the present technology. As soon as the spatial defect in the base metal structural component 44, shown as a crack 34 in FIG. 4A, makes its way to the phase change material 46 (which will be in a liquid/molten state when the electronics component 40 is operational (at a temperature of about 250° C.), capillary action may draw the phase change material 46 to flow into the crack. Once the liquid/molten phase change material 46 contacts and reacts with metals in the adjacent areas of the base metal structural component 44, it forms an intermetallic compound 50, sealing the spatial defect as shown in FIG. 4B. The intermetallic compound 50 exhibits a melting point that is higher than the melting point of the phase change material 46, and even in some instances, higher than the melting point of the base metal structural component 44. In various aspects, the melting point of the intermetallic compound may be between about 400° C.-500° C. or higher, which is much higher than the melting point of Sn, if used as a phase change material for example, exhibiting a melting point of about 232° C.

Figure 7A:
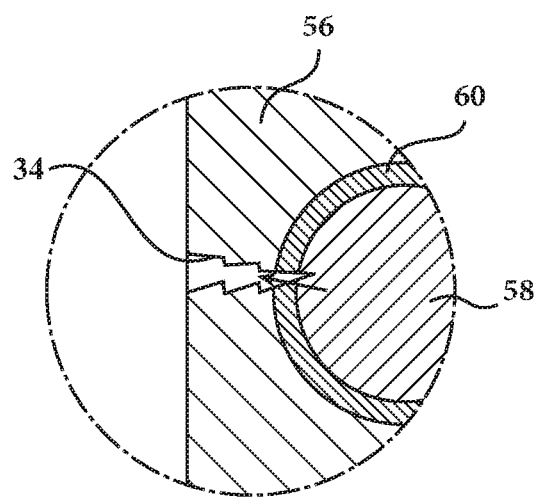
FIGS. 7A and 7B are partial magnified views of FIG. 6, illustrating crack propagation and self-healing according to various aspects of the present technology.
Figure 7B:
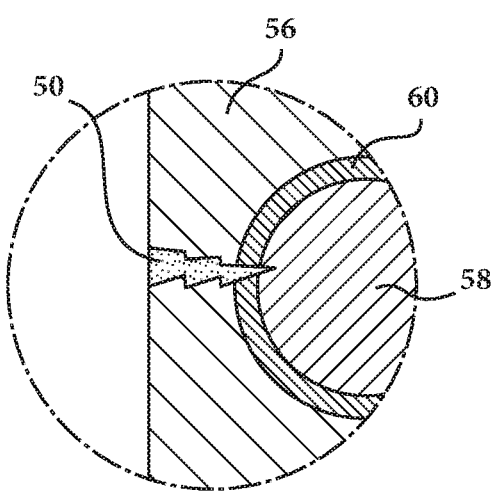

FIGS. 7A and 7B are partial magnified views of the metal structure assembly 52 as provided in FIG. 6, illustrating crack propagation (FIG. 7A) and self-healing (FIG. 7B) according to various aspects of the present technology. Similar to FIGS. 4A and 4B, as soon as the spatial defect in the base metal structural component 56, shown as a crack 34 in FIG. 7A, makes its way to the phase change material 58 (which will be in a liquid/molten state when the electronics component 40 is operational), capillary action may draw the phase change material to flow into the crack 34. Once the liquid/molten phase change material 58 contacts and reacts with metals in the adjacent areas of the base metal structural component 56, it forms an intermetallic compound 50, sealing the spatial defect as shown in FIG. 7B. The intermetallic compound 50 exhibits a melting point that is higher than the melting point of the phase change material 58, and higher than the melting point of the base metal structural component 56.

It should be understood that while the examples of FIG. 2B, FIGS. 4A-4B, and FIGS. 7A-7B are illustrated with the spatial defect being a crack 34, the spatial defect may be any type of defect as mentioned above.

The present technology additional provides various methods for making a self-healing metal structural component 38 useful for transferring heat between components, such as an electronics component 40 and a substrate 42. With reference to the design shown in FIGS. 3-4, the method includes surrounding at least a portion of a base metal structural component 44 with a phase change material 46. As described above, the selection of the phase change material 46 should be such that it has a melting point lower than a melting point of the base metal structural component 44 and the operating temperature of the electronics component 40, while having the propensity to form in intermetallic compound 50 with the base metal structural component 44. The method includes encapsulating at least a portion of the phase change material 46 with a protective component 48. Upon the presence of a spatial defect 34 in the base metal structural component 44, the method includes permitting the phase change material 46 to react with the base metal structural component 44 to form an intermetallic compound 50 to at least partially occupy the spatial defect 34. In certain other aspects, it is envisioned that methods can be used that incorporate metal inverse opal techniques that will encapsulate a phase change material in a base metal structural component, and with a protective component around the phase change material.

With reference to the design shown in FIGS. 6-7, the method includes providing a plurality of capsules 54, each including a phase change material 58 surrounded by a protective component 60, within a base metal structural component 56. Upon the presence of a spatial defect in the base metal structural component, the method includes permitting the phase change material 58 to react with the base metal structural component 56 to form an intermetallic compound 50 to at least partially occupy the spatial defect 34.

As described above, methods of encapsulating at least a portion of the phase change material 46, 58 with a protective metal component may include depositing a conductive material such as platinum or aluminum over the phase change material 46, 58 using an atomic layer deposition technique to encapsulate to a desired thickness.

EXAMPLES

Various aspects of the present disclosure are further illustrated with respect to the following Examples. It is to be understood that these Examples are provided to illustrate specific embodiments of the present disclosure and should not be construed as limiting the scope of the present disclosure in or to any particular aspect.

Example 1, Encapsulation of Phase Change Material Using ALD

In this example, two self-healing capsules are heated on a temperature controlled hot plate. A first capsule is heated without compression, and a second capsule is placed underneath two 50-g weights and. The capsules include a 100 µm thick core indium metal, and a 25 nm thick platinum shell. The first capsule is heated to a temperature of 170° C., which is above the melting point of indium (156° C.). It is observed that the indium inside melted, however, the capsule did not break or leak. This confirms that the ALD encapsulation process is robust and pin-hole free. The second capsule is placed on the heater followed by a glass plate to support two 50-g weights. Once the heater temperature reached 156° C., the indium inside the capsule melts and, in this case, breaks the shell to release indium to the outside environment. This confirms that the combination of high temperature and pressure enables the capsule to break and release the indium.

Example 2, Melting within the Phase Change Material in the Base Metal Structural Component In this example, the melting of indium is checked inside the higher melting point base metal structural component. A Cu substrate is provided with a commercial solder foil placed on top of the substrate. The melting point of the solder is 227° C. The Cu substrate is 10 mm×10 mm, with a thickness of 150 µm. The solder foil is 10 mm×10 mm, with a thickness of 150 µm. The material composition is Sn0.7CuNiP. A self-healing capsule is placed on top of the solder foil followed by two additional pieces of solder foil on top of the capsule. The entire assembly is then placed on a programmable hot plate and heated to a temperature of 280° C. A typical reflow profile used to fabricate bonding samples. At the peak temperature, both the indium and the solder melt; however, the capsule remains intact due to the much higher melting point (1768° C.) of the Pt shell. After sample fabrication is complete and the assembly reaches room temperature, the sample is heated again to 170° C., which is above the melting point of indium but lower than that of the solder. The capsule is then pierced to break the shell, and liquid indium is visually observed.

Example 3, Spread of Liquid Iridium Inside Cu—Cu Bonding System

In this example, the propagation, or spreading, of liquid indium inside the base metal structural component is examined. Two copper plate substrates are soldered with a self-healing capsule embedded inside. The size and thickness of the copper plates and the solder is the same as described in Example 2. The details of the fabrication-process are as follows:

First, the bottom copper substrate is placed on the hot plate surface followed by the solder foil. Second, the self-healing capsule is placed on top of the solder foil, followed by two pieces of solder foil on top of the capsule. Third, the top copper substrate is placed on the solder foil. The assembly is then heated in an air atmosphere to 280° C., for 1 minute, to form the bond between the copper substrates and the solder. After the soldering process, the assembly is cooled to room temperature. The capsule ruptures and releases indium inside the bond (solder) layer. The fabricated sample is cross-sectioned and analyzed using Scanning Electron Microscopy (SEM) and Energy-dispersive X-ray (EDX) to identify indium and IMC formed inside the bond layer.

The foregoing description is provided for purposes of illustration and description and is in no way intended to limit the disclosure, its application, or uses. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations should not be regarded as a departure from the disclosure, and all such modifications are intended to be included within the scope of the disclosure.

As used herein, the phrase at least one of A, B, and C should be construed to mean a logical (A or B or C), using a non-exclusive logical "or." It should be understood that the various steps within a method may be executed in different order without altering the principles of the present disclosure. Disclosure of ranges includes disclosure of all ranges and subdivided ranges within the entire range, including the endpoints.

The headings (such as "Background" and "Summary") and sub-headings used herein are intended only for general organization of topics within the present disclosure, and are not intended to limit the disclosure of the technology or any aspect thereof. The recitation of multiple embodiments having stated features is not intended to exclude other embodiments having additional features, or other embodiments incorporating different combinations of the stated features.

As used herein, the terms "comprise" and "include" and their variants are intended to be non-limiting, such that recitation of items in succession or a list is not to the exclusion of other like items that may also be useful in the devices and methods of this technology. Similarly, the terms "can" and "may" and their variants are intended to be non-limiting, such that recitation that an embodiment can or may comprise certain elements or features does not exclude other embodiments of the present technology that do not contain those elements or features.

The broad teachings of the present disclosure can be implemented in a variety of forms. Therefore, while this disclosure includes particular examples, the true scope of the disclosure should not be so limited since other modifications will become apparent to the skilled practitioner upon a study of the specification and the following claims. Reference herein to one aspect, or various aspects means that a particular feature, structure, or characteristic described in connection with an embodiment or particular system is included in at least one embodiment or aspect. The appearances of the phrase "in one aspect" (or variations thereof) are not necessarily referring to the same aspect or embodiment. It should be also understood that the various method steps discussed herein do not have to be carried out in the same order as depicted, and not each method step is required in each aspect or embodiment.

What is claimed is:

1. A self-healing metal structure, comprising:
   a base metal structural component;
   a phase change material adjacent at least a portion of the base metal structural component; and
   a protective component at least partially encapsulating the phase change material and configured to contain a liquid phase of the phase change material to a specific area,
   wherein, upon propagation of a spatial defect in the base metal structural component reaching the phase change material, the phase change material reacts with the base metal structural component to form an intermetallic compound to at least partially occupy the spatial defect.

2. The self-healing metal structure according to claim 1, wherein the base metal structural component comprises at least one of nickel, copper, and tin.

3. The self-healing metal structure according to claim 1, wherein the phase change material comprises at least one of tin and indium.

4. The self-healing metal structure according to claim 1, wherein the base metal structural component defines a plurality of cooling structures configured for transferring heat from an electronics component to a substrate.

5. The self-healing metal structure according to claim 1, wherein the base metal structural component defines a mesh structure.

6. The self-healing metal structure according to claim 1, wherein the protective component comprises at least one of platinum, aluminum, and alumina.

7. The self-healing metal structure according to claim 1, wherein the intermetallic compound exhibits a melting point higher than a melting point of the phase change material.

8. The self-healing metal structure according to claim 1, wherein the phase change material at least partially encapsulated with the protective component is disposed within the base metal structural component.

9. The self-healing metal structure according to claim 8, wherein the phase change material is present as a plurality of separate capsules incorporated within the base metal structural component.

10. The self-healing metal structure according to claim 1, wherein the phase change material at least partially surrounds the base metal structural component.

11. A power module comprising the self-healing metal structure according to claim 1.

12. A self-healing metal structure assembly for transferring heat between an electronics component and a substrate, the self-healing metal structure assembly comprising:
    an electronics component;
    a substrate;
    a base metal structural component providing thermal communication between the electronics component and the substrate;
    a phase change material in contact with at least a portion of the base metal structural component; and
    a protective metal component encapsulating the phase change material and configured to contain a liquid phase of the phase change material to a specific area,
    wherein, upon propagation of a spatial defect in the base metal structural component reaching the phase change material, the phase change material reacts with the base metal structural component to form an intermetallic compound to at least partially occupy the spatial defect.

13. The self-healing metal structure assembly according to claim 12, wherein the phase change material encapsulates at least a portion of the base metal structural component.

14. The self-healing metal structure assembly according to claim 12, wherein the phase change material exhibits a melting point lower than an operating temperature of the electronics component.

15. The self-healing metal structure assembly according to claim 12, wherein the base metal structural component comprises at least one of nickel, copper, and tin.

16. The self-healing metal structure assembly according to claim 12, wherein the phase change material comprises at least one of a post-transition metal and a metalloid.

17. The self-healing metal structure assembly according to claim 12, wherein the phase change material comprises at least one of tin and indium, and the protective metal component comprises at least one of platinum, aluminum, and alumina.

18. A self-healing metal structure, comprising:
    a base metal structural component;
    a plurality of separate capsules incorporated within the base metal structural component, each capsule comprising a phase change material encapsulated with a protective metal component;
    wherein, upon propagation of a spatial defect in the base metal structural component reaching the phase change material, the phase change material reacts with the base metal structural component to form an intermetallic compound to at least partially occupy the spatial defect.

* * * * *